(12) United States Patent
Kang et al.

(10) Patent No.: US 8,963,275 B2
(45) Date of Patent: Feb. 24, 2015

(54) RESISTIVE-SWITCHING DEVICE CAPABLE OF IMPLEMENTING MULTIARY ADDITION OPERATION AND METHOD FOR MULTIARY ADDITION OPERATION

(71) Applicant: Peking University, Beijing (CN)

(72) Inventors: Jinfeng Kang, Beijing (CN); Bin Gao, Beijing (CN); Lifeng Liu, Beijing (CN); Xiaoyan Liu, Beijing (CN)

(73) Assignee: Peking University, Beijing (CN)

( * ) Notice: Subject to any disclaimer, the term of this patent is extended or adjusted under 35 U.S.C. 154(b) by 13 days.

(21) Appl. No.: 13/706,744

(22) Filed: Dec. 6, 2012

(65) Prior Publication Data

US 2013/0119337 A1    May 16, 2013

Related U.S. Application Data

(63) Continuation of application No. PCT/CN2011/074367, filed on May 20, 2011.

(30) Foreign Application Priority Data

Jun. 13, 2010   (CN) .......................... 2010 1 0207339

(51) Int. Cl.
    *H01L 27/24*    (2006.01)
    *H01L 45/00*    (2006.01)
    (Continued)

(52) U.S. Cl.
    CPC ........ *H01L 27/2409* (2013.01); *H01L 45/1253* (2013.01); *G11C 13/003* (2013.01); *G11C 2213/72* (2013.01); *H01L 27/2463* (2013.01); *G11C 13/0007* (2013.01); *G11C 17/06* (2013.01); *H01L 45/04* (2013.01);
    (Continued)

(58) Field of Classification Search
    CPC ........................... H01L 29/47; H01L 45/1253
    USPC ........... 257/4, 54, 73, 476, E29.148; 438/570
    See application file for complete search history.

(56) References Cited

U.S. PATENT DOCUMENTS

| 4,203,123 A |   | 5/1980 | Shanks |
|---|---|---|---|
| 4,442,507 A | * | 4/1984 | Roesner ......................... 365/100 |
| 4,862,244 A | * | 8/1989 | Yamagishi .................... 257/484 |

(Continued)

FOREIGN PATENT DOCUMENTS

| CN | 1764982 A | 4/2006 |
|---|---|---|
| CN | 101106151 A | 1/2008 |

(Continued)

OTHER PUBLICATIONS

First Examination and Search Report dated Jul. 20, 2012 issued by the State Intellectual Property Office of China for the Chinese corresponding patent application No. 201010207339.0, including its English translation.

*Primary Examiner* — Allan R Wilson
(74) *Attorney, Agent, or Firm* — BainwoodHuang

(57) ABSTRACT

A resistive-switching random access memory device includes a memory cell disposed between a bit line and a word line, the memory cell having a resistive-switching element (40) and a Schottky diode (30). The Schottky diode (30) and the resistive-switching element (40) are connected in series. The Schottky diode (30) includes a metal layer and a semiconductor layer contacting each other. An interface between the metal layer and the semiconductor layer has a non-planar shape.

8 Claims, 3 Drawing Sheets

(51) Int. Cl.
   *G11C 17/06*     (2006.01)
   *G11C 13/00*     (2006.01)
(52) U.S. Cl.
   CPC .......... *H01L 45/146* (2013.01); *H01L 45/1683* (2013.01); *H01L 27/2481* (2013.01); *H01L 45/122* (2013.01)
   USPC .................. 257/476; 257/E29.148; 438/570

(56) References Cited

U.S. PATENT DOCUMENTS

| | | | |
|---|---|---|---|
| 5,296,722 A * | 3/1994 | Potash et al. | 257/50 |
| 6,118,135 A | 9/2000 | Gonzalez et al. | |
| 7,408,212 B1 | 8/2008 | Luan et al. | |
| 7,829,875 B2 * | 11/2010 | Scheuerlein | 257/2 |
| 8,487,292 B2 * | 7/2013 | Sekar et al. | 257/4 |
| 2008/0185573 A1 * | 8/2008 | Sun et al. | 257/4 |
| 2009/0014707 A1 * | 1/2009 | Lu et al. | 257/4 |
| 2009/0272961 A1 * | 11/2009 | Miller et al. | 257/4 |
| 2010/0090187 A1 * | 4/2010 | Ahn et al. | 257/2 |
| 2011/0220918 A1 * | 9/2011 | Sugai | 257/77 |
| 2011/0227024 A1 * | 9/2011 | Sekar et al. | 257/4 |
| 2012/0168705 A1 * | 7/2012 | Liu et al. | 257/4 |

FOREIGN PATENT DOCUMENTS

| | | |
|---|---|---|
| CN | 101477987 A | 7/2009 |
| CN | 101541489 A | 9/2009 |

* cited by examiner

RESISTIVE-SWITCHING DEVICE CAPABLE OF IMPLEMENTING MULTIARY ADDITION OPERATION AND METHOD FOR MULTIARY ADDITION OPERATION

TECHNICAL FIELD

The present disclosure relates to a memory device, and particularly to a resistive-switching random access memory device (RRAM).

The present disclosure also relates to a manufacturing method of the resistive-switching random access memory device.

BACKGROUND

Currently, memory technology is being continuously developed with the advancement of microelectronics industry. An object of the memory industry is to enhance integration density and reduce manufacturing cost. A non-volatile memory has an advantageous ability of holding data without power supply and thus plays an important role in information storage field.

There has been developed a new-type non-volatile memory using resistive-switching material(s). The non-volatile memory has advantages such as high speed (<5 ns), low power consumption (<1V), high storage density, and adaptability for integration, and thus is a competitive candidate for the next-generation semiconductor memory. The resistive-switching memory typically has an M-I-M (Metal-Insulator-Metal) structure. That is, a resistive-switching material layer is sandwiched between two metal electrodes.

The resistive-switching material is typically a transition metal oxide, such as NiO, $TiO_2$, $HfO_2$, $ZrO_2$, or ZnO, etc. The resistive-switching material can present two stable states: a high-resistance state corresponding to data '0' and a low-resistance state correspond to data '1'. Transition from the high-resistance state to the low-resistance state is called a program or set operation, and transition from the low-resistance state to the high-resistance state is called an erase or reset operation.

The resistive-switching memory devices can be categorized into a unipolar type and a bipolar type according to the operation modes thereof. In the operation of a unipolar resistive-switching memory device, voltage levels of a same polarity are applied across the device. The resistive-switching material switches between the high-resistance state and the low-resistance state under control of the amplitude of the applied voltage to implement a write or erase operation of data. In the operation of a bipolar resistive-switching memory device, however, voltage levels of opposite polarities are applied across the device to control the resistive-switching material to switch between the high-resistance state and the low-resistance state. The bipolar resistive-switching memory device has better performances than the unipolar memory device in switching speed, device uniformity, reliability (e.g., ability of maintaining data and switchable number), and controllability.

The resistive-switching memory devices can be categorized into a 1T-1R type and a 1D-1R type according to the basic configurations thereof. In a 1T-1R configuration, each memory cell comprises a gating transistor and a resistive-switching element. Data can be written into or erased from a specific memory cell by controlling the gating transistor. Most area of the memory cell is occupied by the gating transistor, which constitute a severe obstacle in improving the integration of the memory device. In a 1D-1R configuration, each memory cell comprises a diode and a resistive-switching element. Data can be written into or erased from a specific memory cell by controlling the diode. Because the diode has an area smaller than that of the transistor, 1D-1R configuration is more advantageous in enhancing integration.

A Schottky diode based on metal-semiconductor contact principle has a large backward current controlled by the metal material and externally-applied bias voltage. The inventor realized that a 1D-1R resistive-switching random access memory device that operates in the bipolar mode can be achieved by connecting a bipolar resistive-switching element in series with a Schottky diode, which is selected to have suitable diode switch parameters under forward bias and backward bias.

However, the Schottky diode must have a sufficient area to provide the current required in driving the resistive-switching cell to switch between respective resistance states due to the limitation of current density. This prevents a further enhancement of the storage density of the resistive-switching random access memory device.

SUMMARY

The present disclosure provides, among other things, a resistive-switching random access memory device that has a smaller footprint on a chip and can be integrated in a 3D manner.

The present disclosure further provides a method for manufacturing the resistive-switching random access memory device.

According to an aspect of the present disclosure, there is provided a resistive-switching random access memory device comprising a memory cell disposed between a bit line and a word line, the memory cell comprising: a resistive-switching element; and a Schottky diode being connected in series with the resistive-switching element, wherein the Schottky diode comprises a metal layer and a semiconductor layer contacting each other, and an interface between the metal layer and the semiconductor layer has a non-planar shape.

According to another aspect of the present disclosure, there is provided a method for manufacturing a resistive-switching random access memory device, comprising:

a) forming a bit line on a substrate;

b) forming a trench in an insulation layer on the substrate to expose a surface of the bit line at a bottom of the trench;

c) forming a conformal polysilicon layer in the trench;

d) doping the polysilicon layer with a dopant to form a p-doped polysilicon layer;

e) forming a first metal layer on the p-doped polysilicon layer;

f) forming a resistive-switching material layer on the first metal layer;

g) forming a second metal layer on the resistive-switching layer; and h) forming a word line on the second metal layer.

In the resistive-switching random access memory device according to the present disclosure, the Schottky diode is formed in the trench for example. As a result, the interface between the metal layer and the semiconductor layer in the Schottky diode has an area larger than that of the bottom of the trench. In this way, the footprint of the memory cell is reduced and the diode has a sufficient effective area to provide driving current required by the resistive-switching random access memory device.

Also, the resistive-switching random access memory device according to the present disclosure may comprise a plurality of memory cells being stacked in a perpendicular direction, which further enhances storage density.

The Schottky diode based on metal silicide can be manufactured by a simple process at low cost. The process is compatible with conventional processes and suitable for large-scale manufacture.

DETAILED DESCRIPTION OF THE PREFERRED EMBODIMENTS

Next, the present disclosure will be explained in detail with reference to the drawings. In the various drawings, similar components are represented by similar reference signs. The drawings are not drawn to scale for purpose of clarity.

It should be understood that, in description of the structure of the device, when a layer or region is referred to be "on," "over," or "above" another layer or region, it can be directly on the other layer or region or there may be further layer(s) or region(s) between the layer or region and the other layer or region. If the device is turned over, the layer or region will be "under," "beneath," or "below" the other layer or region.

In case where the layer or region is directly on the other layer or region, it will be described as "directly on" or "on and abut."

The following description includes various specific details of the present disclosure, e.g., structures, materials, and sizes of the device, as well as processes and technologies for manufacturing the same, in order to facilitate understanding of the present disclosure. However, one of ordinary skill in the art will understand that the present disclosure can be implemented without theses specific details.

Various parts of the semiconductor device can comprise materials well-known to one of ordinary skill in the art, unless otherwise explicitly indicated.

Figure 1:
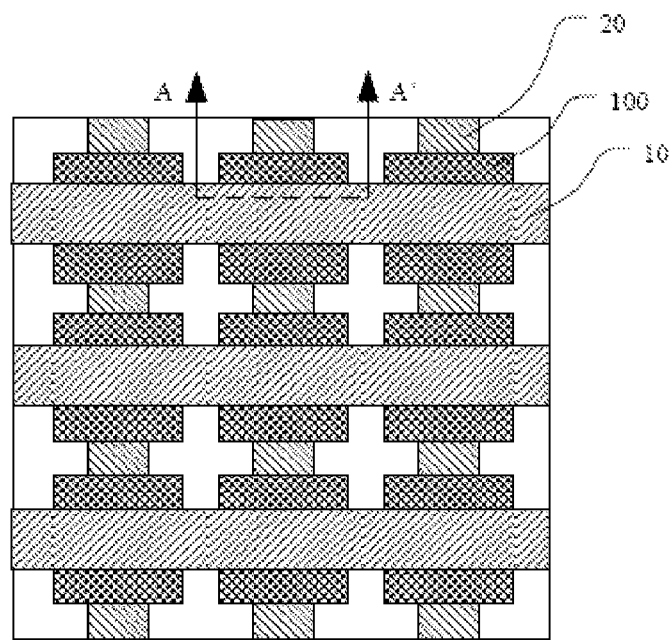
FIG. 1 is a top view of a resistive-switching random access memory device according to the present disclosure, in which an array comprising 3*3 memory cells is shown.

FIG. 1 is a top view of a resistive-switching random access memory device according to the present disclosure, in which an array comprising 3*3 memory cells is shown.

The resistive-switching random access memory device comprises a word line 10, a bit line 20, and a memory cell 100 disposed between the word line 10 and the bit line 20. The word line 10 and the bit line 20 are perpendicular with respect to each other. A memory cell 100 is disposed at a cross point of each word line 10 and each bit line 20.

Figure 2:
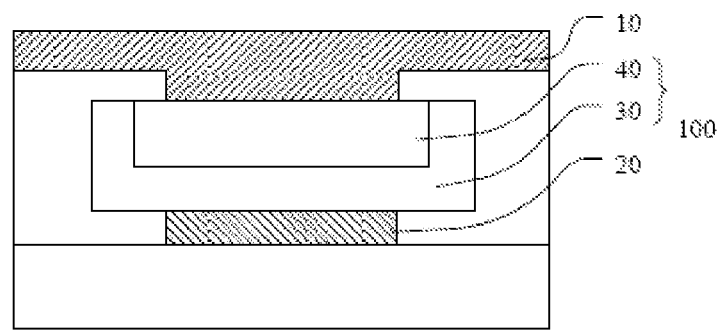
FIG. 2 is a cross-sectional view of a resistive-switching random access memory device according to a first embodiments of the present disclosure, which is taken along an A-A' line of FIG. 1 and shows a structure of a memory cell.

FIG. 2 is a cross-sectional view of a resistive-switching random access memory device according to a first embodiment of the present disclosure, which is taken along an A-A' line of FIG. 1 and shows a structure of a memory cell. Each memory cell 100 comprises a Schottky diode 30 and a bipolar resistive-switching element 40 being connected in series.

The memory cell 100 is disposed in a trench in an insulation layer (e.g., a silicon oxide layer) so that a metal layer and a semiconductor layer of the Schottky diode 30, which is to be formed, has an interface with a non-planar shape, such as a "U" shape. As a result, an effective area of the Schottky diode depends on an area of the interface between the metal layer and the semiconductor layer. The effective area comprises portions on side faces of the trench in addition to a portion at a bottom of the trench. In case where the trench is deep, the effective area of the Schottky diode may be much larger than its footprint. Accordingly, the footprint of the memory cell can be reduced.

Figure 3:
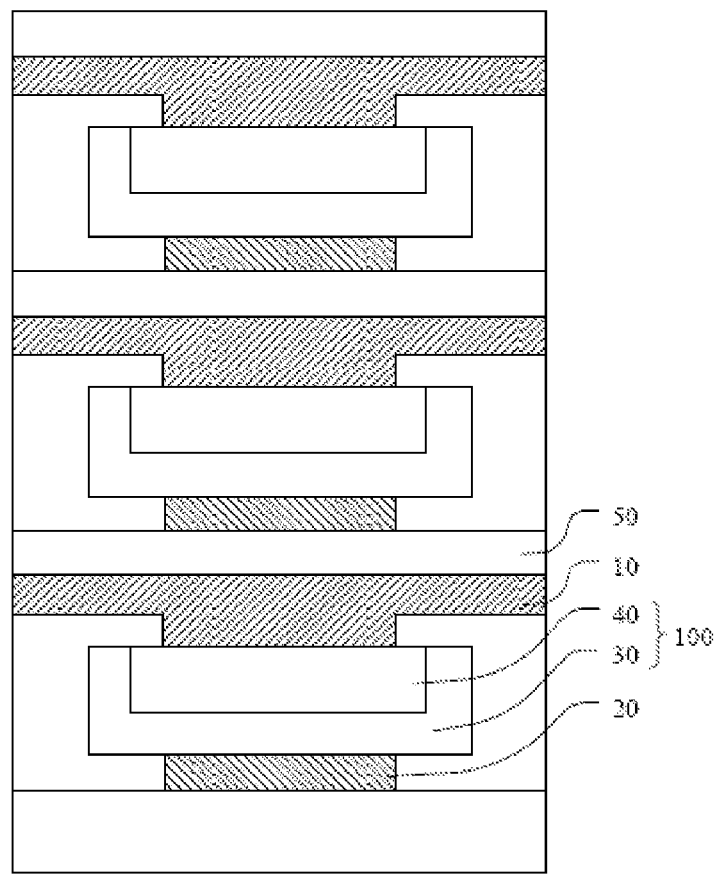
FIG. 3 is a cross-sectional view of a 3D-integrated resistive-switching random access memory device according to a second embodiments of the present disclosure, which is taken along an A-A' line of FIG. 1 and shows a structure of three memory cells being stacked in a perpendicular direction.

FIG. 3 is a cross-sectional view of a 3D-integrated resistive-switching random access memory device according to a second embodiment of the present disclosure, which is taken along an A-A' line of FIG. 1. The memory cell according to the second embodiment differs from that according to the first embodiment in that it comprises three memory cells being stacked in a perpendicular direction. As a result, for the same footprint, the memory cell according to the second embodiment has a storage density three times higher than the memory cell according to the first embodiment. In the perpendicular direction, the three memory cells are electrically isolated from each other with isolation layers (e.g., silicon oxide layers) 50.

When it is allowed by semiconductor processes, one of ordinary skill in the art can stack two or more memory cells in the perpendicular direction as required to further enhance the storage density.

Next, a method for manufacturing a 3D-integrated resistive-switching random access memory device according to the present disclosure will be described with reference to FIGS. 4a-4i. Materials used in the method according to the present disclosure are all well-known to one of ordinary skill in the art.

Figure 4:
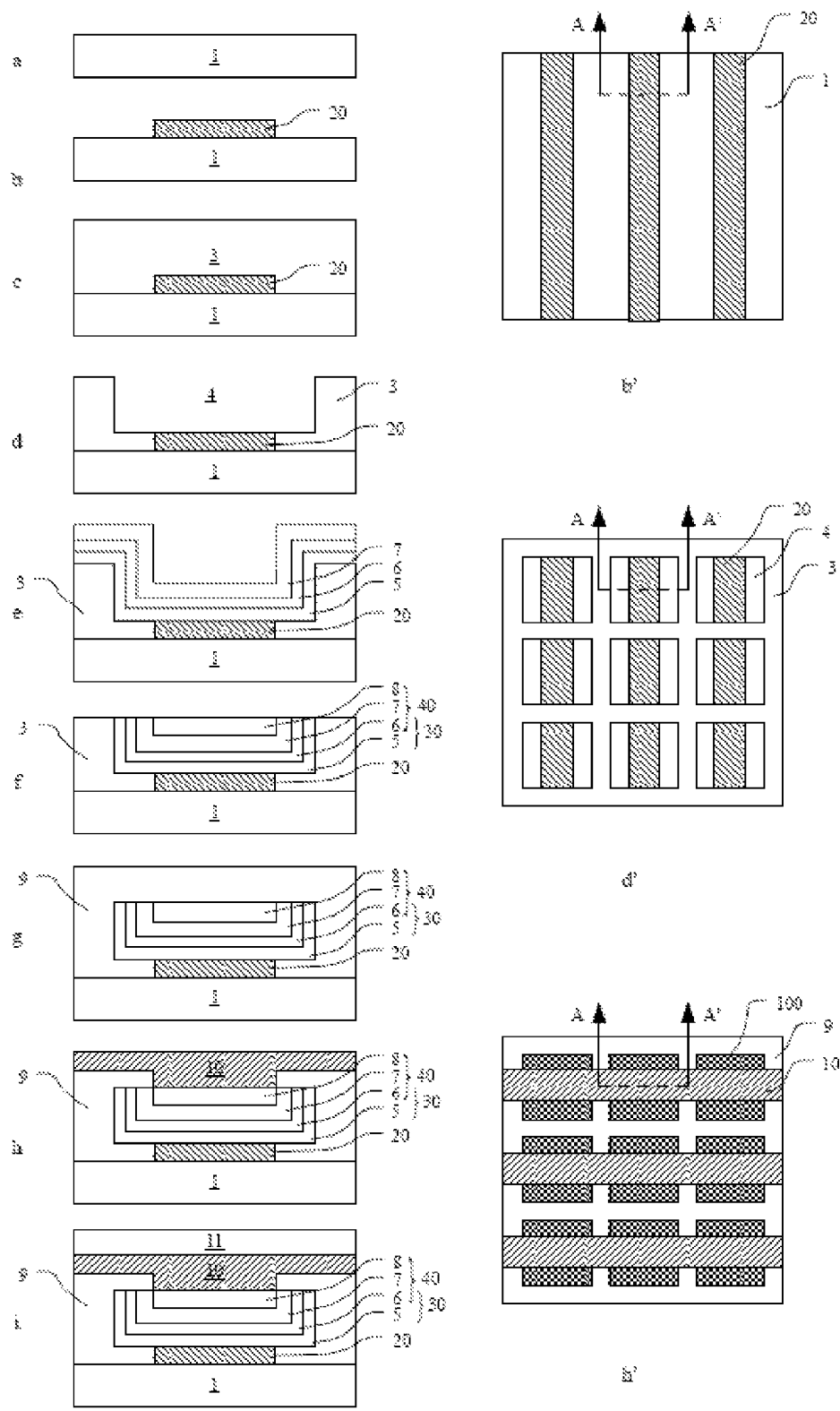
FIGS. 4a-4i show cross-sectional views of the resistive-switching random access memory device according to the first embodiment of the present disclosure at respective stages of the manufacturing method thereof, in which FIGS. 4b', 4d', and 4h' are top views corresponding to FIGS. 4b, 4d, and 4h, respectively, and there is also shown a line A-A' for taking the cross-sectional views.

As shown in FIG. 4a, a bottom insulation layer 1 is formed on a silicon substrate (not shown). The bottom insulation layer 1 has a thickness larger than 20 nm. The bottom insulation layer 1 is configured to electrically isolate the memory cell 100 from other memory cells or other elements in the memory device.

The bottom insulation layer 1 can be a silicon oxide layer formed on the silicon substrate by thermal oxidation. Alternatively, the bottom insulation layer 1 may be formed by depositing an oxide layer or a nitride layer on the silicon substrate by known deposition process, such as CVD, atom layer deposition, or sputtering, etc.

Then, a metal (e.g., Pt, Al, W, or Cu, etc.) layer is formed on the bottom insulation layer 1 by, e.g., physical vapor deposition (PVD). The metal layer has a thickness of about 20-100 nm. A plurality of stripe-shaped bit lines 20 (as shown in FIGS. 4b and 4b') parallel to each other are formed by patterning the metal layer. The width of the bit line 20 and the space distance between adjacent bit lines are determined by the precision of photolithography.

The patterning process may comprise forming a patterned photo resist mask on the metal layer by photolithography including exposure and developing. Exposed portions of the metal layer may be removed by dry etching such as ion milling etching, plasma etching, reactive ion etching, or laser ablation, or wet etching using etching agent solution. The etching may stop at a top of the bottom insulation layer 1. The photo resist mask is removed by being resolved in a solution or being ashed.

Next, a first insulation layer (e.g. a silicon oxide layer) 3 is formed on an exposed surface of the bottom insulation layer 1 and the word line 20 by a known deposition process as listed above. The first insulation layer 3 may have a thickness of about 500-2000 nm. A surface of the whole semiconductor structure is planarized by chemically mechanical polishing (CMP), as shown in FIG. 4c.

The first insulation layer 3 is patterned to form an array of rectangle-shaped trenches 4, as shown in FIGS. 4d and 4d'. In the patterning, etching stops at a top surface of the bit line 20. For example, the trench 4 may have a width slightly larger than that of the bit line 20 by about 15-50 nm. The trench 4 may have a depth of about 500-1500 nm. As a result, the Schottky diode may have an effective area (i.e., the area of an interface between the metal layer and the semiconductor layer of the Schottky diode) larger than its actual footprint (i.e., the area of the bottom of the trench 4) by about 60 times at most.

Then, a polysilicon layer 5 with a thickness of about 5-10 nm, a metal layer (e.g., a platinum layer) 6 with a thickness of about 5-10 nm, and a resistive-switching layer (e.g. a hafnium dioxide layer) 7 with a thicknesses of about 5-30 nm are formed in a conformal manner in sequence on the surface of the whole semiconductor structure by a known deposition process as listed above. The polysilicon layer 5 and the metal layer 6 will constitute the Schottky diode 30.

Optionally, the polysilicon layer 5 may be formed by CVD, and the metal layer 6 may be formed by PVD.

The polysilicon layer is doped with boron or boron trifluoride. The dopant may have a concentration of about $10^{13} \sim 10^{18}/cm^3$. Then the polysilicon layer is subjected to annealing at 600~800° C.

Although in the optional embodiment, the polysilicon layer 5, the metal layer 6, and the resistive-switching layer 7 are all formed in the conformal manner, only the conformal polysilicon layer 5 is necessary for the present disclosure. The metal layer 6 and the resistive-switching layer 7 may not necessarily be conformal.

Next, a metal layer (e.g., a Pt, Ti, Ta, W, or Al layer) 8 is deposited on the surface of the whole semiconductor structure. The metal layer 8 may have a thickness at least filling remaining part of the trench 4. The metal layer 6, the resistive-switching layer 7, and the metal layer 8 constitute a bipolar resistive-switching element 40. The metal layer 6 and the metal layer 8 function as a top electrode and a bottom electrode of the bipolar resistive-switching element 40, respectively.

The metal layer 6 is shared by the Schottky diode 30 and the bipolar resistive-switching element 40 and connects the Schottky diode 30 and the bipolar resistive-switching element 40 in series. This can reduce interconnection resistance and reduce required driving current.

The surface of the whole semiconductor structure is planarized by CMP, which stops at a top surface of the first insulation layer 3 surrounding the trench to remove conductive materials outside the trench, as shown in FIG. 4f.

A second insulation layer 9 with a thickness of about 20-100 nm is formed on the whole semiconductor structure by a known deposition process as listed above, e.g., CVD, as shown in FIG. 4g.

The second insulation layer 9 contacts the first insulation layer 3 directly in regions surrounding the trench 4. When the first insulation layer 3 and the second insulation layer 9 are both formed by silicon oxide, there is no obvious interface therebetween, as shown in the figure.

The memory cell 100 comprises a Schottky diode 30 and a bipolar resistive-switching element 40 connected in series and is completely covered and surrounded by the second insulation layer 9 at this stage.

Next, the second insulation layer 9 is patterned by two times of photolithography and etching to form a plurality of T-shaped word line trenches parallel to each other. The top electrode of the bipolar resistive-switching element 40 is exposed at a bottom of the word line trench.

The word line trench extends in a direction perpendicular to the extension direction of the bit line 20. The word line trenches have a width and a space distance generally the same as the width and the space distance of the bit lines.

A metal layer (e.g., an aluminum layer) is formed on the surface of the whole semiconductor structure by e.g. PVD. The metal layer fills the word line trenches. The surface of the whole semiconductor structure is planarized by CMP using portions of the second insulation layer 9 at opposing sides of the respective word line trenches as a stop layer. Metal material remained in the word line trenches form the word lines 10, as shown in FIGS. 4h and 4h'.

A top insulation layer 11 with a thickness larger than 20 nm is formed on the whole semiconductor structure, as shown in FIG. 4i. The top insulation layer 11 covers the word lines 10 to electrically isolate the word lines from other elements in the memory device.

The resistive-switching random access memory device according to the first embodiment of the present disclosure is formed by the above-described method including steps shown in FIGS. 4a-4i.

Optionally, the steps as shown in FIGS. 4b-4i may be repeated on the top insulation layer 11 to form a plurality of stacked memory cells, so as to form a 3D-integrated resistive-switching random access memory device according to the second embodiment of the present disclosure.

Then, subsequent steps such as wiring and passivation can be performed to complete the memory device according to the present disclosure. These subsequent steps are well-known to one of ordinary skill in the art.

Although not shown, each word line and each bit line of the resistive-switching random access memory device according to the present disclosure are connected at respective ends thereof with respective gating transistors. When read and write operations are performed, a pair of gating transistors corresponding to the access address are turned on to enable access to a corresponding pair of word line and bit line.

As to the 3D-integrated resistive-switching random access memory device according to the second embodiment of the present disclosure, each memory cell can be accessed individually.

The foregoing description is only for illustrating and describing rather than exhausting or limiting the present disclosure. Therefore, the present disclosure is not limited to the described embodiments. Any modifications or alternations obvious to one of ordinary skill in the art will fall within the protection scope of the present disclosure.

What is claimed is:

1. A resistive-switching random access memory device comprising a memory cell disposed between a bit line and a word line, the memory cell comprising:
   a resistive-switching element; and
   a Schottky diode being connected in series with the resistive-switching element,
   wherein the Schottky diode comprises a metal layer and a semiconductor layer contacting each other, and an interface between the metal layer and the semiconductor layer has a non-planar shape so that the interface has an area greater than that of a bottom surface of the semiconductor layer.

2. The resistive-switching random access memory device according to claim 1, further comprising an insulation layer, wherein the memory cell is formed in a trench of the insulation layer, so that the semiconductor layer of the Schottky diode is disposed on a bottom and side surfaces of the trench in a conformal manner.

3. The resistive-switching random access memory device according to claim 2, wherein at least two memory cells are stacked in a perpendicular direction, and the resistive-switching random access memory device further comprises an isolation layer for isolating the adjacent memory cells in the perpendicular direction.

4. The resistive-switching random access memory device according to claim 1, wherein at least two memory cells are stacked in a perpendicular direction, and the resistive-switching random access memory device further comprises an isolation layer for isolating the adjacent memory cells in the perpendicular direction.

5. The resistive-switching random access memory device according to claim 1, wherein the resistive-switching element comprises a bipolar resistive-switching element.

6. The resistive-switching random access memory device according to claim 1, wherein the resistive-switching element is configured to be reversibly switched between a high-resistance state and a low-resistance state based on a voltage applied thereto through the bit line and the word line.

7. The resistive-switching random access memory device according to claim 1, wherein the resistive-switching element comprises the metal layer, a resistive-switching layer, and a further metal layer, wherein the resistive-switching layer is arranged between the metal layer and the further metal layer.

8. The resistive-switching random access memory device according to claim 2, wherein a portion of the semiconductor layer extending along the side surface of the trench is protruded with respect to a portion of the semiconductor layer extending along the bottom surface of the trench.

* * * * *